United States Patent [19]

Harris

[11] 4,042,954
[45] Aug. 16, 1977

[54] METHOD FOR FORMING GANG BONDING BUMPS ON INTEGRATED CIRCUIT SEMICONDUCTOR DEVICES

[75] Inventor: James M. Harris, San Jose, Calif.

[73] Assignee: National Semiconductor Corporation, Santa Clara, Calif.

[21] Appl. No.: 578,653

[22] Filed: May 19, 1975

[51] Int. Cl.² .......................... B05D 5/12; H01L 23/48
[52] U.S. Cl. ............................................ 357/71; 427/89; 427/91; 427/261; 29/589; 29/630 R; 428/901
[58] Field of Search ...................... 427/89, 90, 91, 92, 427/261; 29/589, 590, 591, 630 R; 357/71

[56] References Cited

U.S. PATENT DOCUMENTS

| 3,480,841 | 11/1969 | Castrucci et al. | 29/589 |
| 3,622,385 | 11/1971 | Stork | 427/91 |
| 3,706,015 | 12/1972 | Schimmer et al. | 29/589 |

FOREIGN PATENT DOCUMENTS

| 1,363,491 | 1964 | France | 427/89 |

Primary Examiner—Ralph S. Kendall
Assistant Examiner—Charles R. Wolfe, Jr.
Attorney, Agent, or Firm—Gail W. Woodward; Willis E. Higgins

[57] ABSTRACT

Gang bonding bumps, for making electrical connection to a metallic intraconnect pattern of metallization on an integrated circuit semiconductive device, are adhered to the interconnect pattern via the intermediary of a series of transition layers. These transition layers include a first layer of chromium, vacuum evaporated over the metallic interconnect pattern for providing a tightly adherent connection thereto. A layer of aluminum and chromium is vacuum evaporated over the chromium layer. A second layer of chromium is vacuum evaporated over the aluminum and chromium layer and a gold layer is deposited overlaying the chromium layer. The gold layer interfaces with the electroplated layers of the bump, which in a preferred embodiment consists of a lower layer of nickel covered by a layer of copper.

10 Claims, 1 Drawing Figure

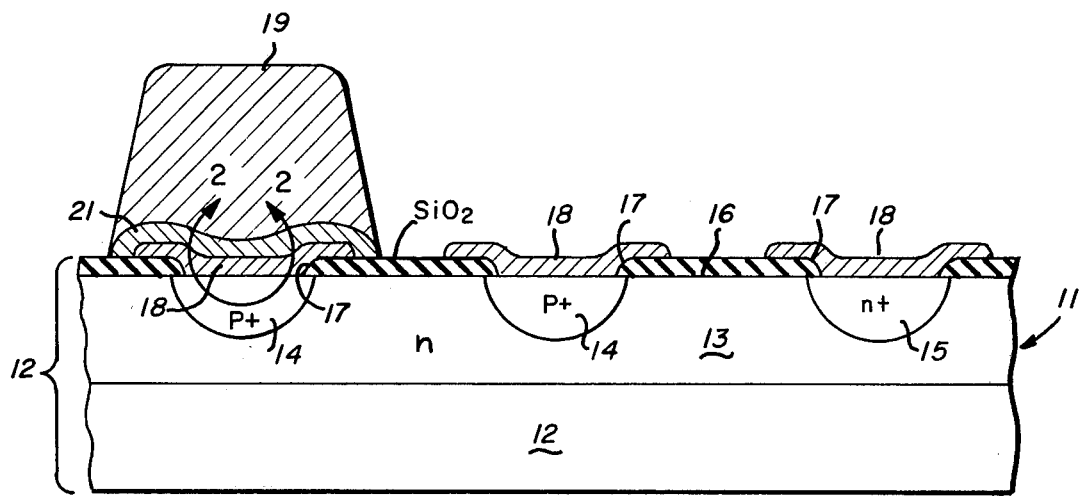
Fig_1
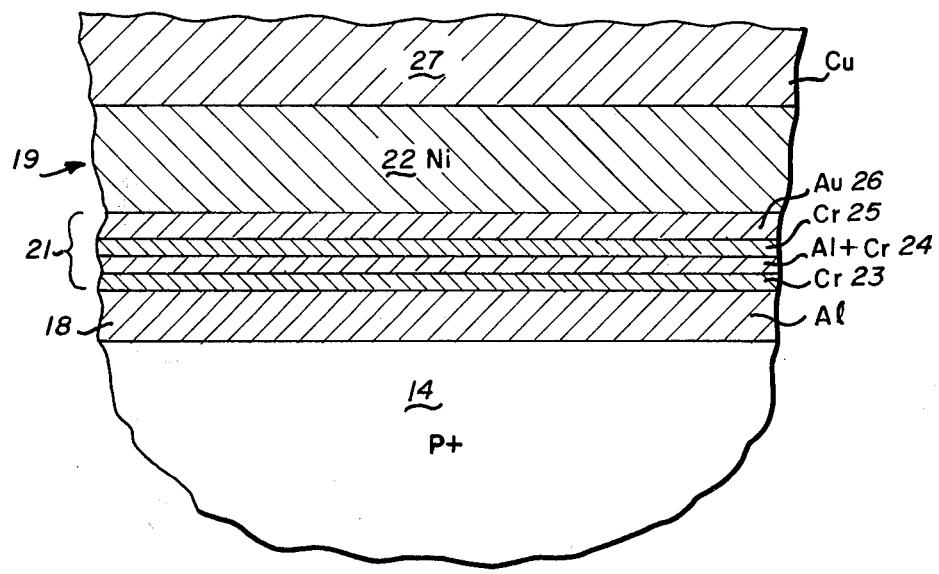
Fig_2

METHOD FOR FORMING GANG BONDING BUMPS ON INTEGRATED CIRCUIT SEMICONDUCTOR DEVICES

BACKGROUND OF THE INVENTION

The present invention relates in general to methods of joining gang bonding bumps to an underlying metallic interconnect pattern on an integrated circuit semiconductive device.

DESCRIPTION OF THE PRIOR ART

Heretofore, gang bonding bumps of copper or gold have been interfaced and adhered to an underlying metallic pattern of interconnect metallization via the intermediary of a plurality of metallic layers to form a tightly adherent transition region between the underlying metallic interconnect pattern and the overlaying metallic gang bonding bumps. These transition layers have included aluminum/nickel/gold, in that order, which is troubled by oxidation of the nickel during processing of the device so that relatively weak mechanical transition connections are provided between the gang bonding bumps and the underlying metallization.

Others have attempted transition layers consisting of chromium/chromium and silver/silver, in that order, which while providing relatively high strength bonds between the gang bonding bump and the underlying metallization introduces a complexity into the etching step which is necessary in the process for defining the transition region for attaching the gang bonding bumps ont the integrated circuit.

Others have attempted chromium/copper/gold and aluminum/nickel/chromium/gold. These other techniques are either not applicable to electroplating of the bumps onto the transition layers or are relatively difficult to etch.

SUMMARY OF THE PRESENT INVENTION

The principal object of the present invention is to provide an improved method for forming gang bonding bumps on integrated circuit semiconductor devices and, more particularly, to an improved transition structure for transitioning between the underlying metallic interconnect layer and the overlying metallic gang bonding bumps.

In one feature of the present invention, the transition structure for transitioning the gang bonding bump to the underlying pattern of interconnect metallization includes a plurality of metallic layers ascending from the underlying metallic interconnect layer according to the sequence; chromium, aluminum and chromium, chromium, gold.

In another feature of the present invention, the first chromium layer of the transition structure is vacuum vapor deposited to a thickness within the range of 40–200 angstroms, the aluminum and chromium layer is vacuum vapor deposited to a thickness with the range of 3000–20,000 angstroms and comprises between 0.1 and 5% chromium, the second chromium layer is vacuum vapor deposited to a thickness falling within the range of 50–3,000 angstroms, and the gold layer is deposited to a thickness falling within the range of 50–1,500 angstroms.

Other features and advantages of the present invention will become apparent upon a perusal of the following specification taken in connection with the accompanying drawings wherein:

BRIEF DESCRIPTION OF THE DRAWINGS

FIG. 1 is a sectional view of a semiconductive integrated circuit having gang bonding bumps formed thereon and adhered to the underlying pattern of metallization via the intermediary of a transition structure incorporating features of the present invention, and FIG. 2 is an enlarged detail view of a portion of the structure of FIG. 1 delineated by line 2—2.

DESCRIPTION OF THE PREFERRED EMBODIMENTS

Referring now to FIG. 1, there is shown an integrated circuit semiconductive device 11 incorporating features of the present invention. Semiconductive device 11 includes a semiconductive wafer 12, as of silicon, having an epitaxial $n$ type conductivity layer 13 grown thereon. A plurality of $p+$ type conductivity regions 14 are diffused into the $n$ layer 13 and an $n+$ conductivity region 15 is diffused into the $n$ layer 13 for making electrical connection thereto. A silicon dioxide passivating layer 16 is deposited overlaying the epitaxial layer 13.

The passivating layer 16 includes a plurality of apertures 17 therein for making electrical connection to the underlying $p+$ and $n+$ type regions 14 and 15 via the intermediary of an intraconnect pattern of metallization 18, as of aluminum. A plurality of metallic gang bonding bumps 19 are disposed over certain regions of the intraconnect layer 18 and are adhered thereto via the intermediary of a transition metallic structure of layers 21. The bumps 19 are for the purpose of making gang bonds, such as those encountered in beam lead bonding, flip chip bonding and microinterconnect, i.e., tape bonding, wherein integrated circuits are bonded to a metal pattern carried from a tape by automatic gang bonding machines.

Referring now to FIG. 2 the transition layer structure 21 is shown in greater detail. The transition structure 21 includes a plurality of layers transitioning between the metallic intraconnect layer 18 and a nickel plate layer 22 of the thermal compression bump 19.

A first layer 23 of the transition structure 21 is made of chromium and is vacuum vapor deposited, as by evaporation or sputtering, onto the aluminum layer 18 to a thickness within the range of 40-200 angstroms. This first layer of chromium serves as an adhesion layer to provide adhesion between successive layers and the aluminum or metallic intraconnect layer 18. The chromium also provides a high degree of adhesion to the silicon dioxide passivating layer 16 at the region around the periphery of the bump 19 where the bump 19 overlays the silicon dioxide layer 16.

The next layer 24 is a vacuum vapor deposited layer of aluminum and chromium simultaneously deposited onto the chromium layer 23. In a preferred embodiment, the aluminum and chromium layer is a vacuum evaporated layer deposited to a thickness within the range of 3,000–20,000 angstroms and comprises 0.1–5% chromium by volume. The aluminum and chromium layer 24 provides relatively high electrical conductivity for the transition region 21 and the chromium adds strength to the aluminum portion of the layer.

A second chromium layer 25 is vacuum vapor deposited onto the aluminum and chromium layer 24 to a thickness within the range of 50–3,000 angstroms. The second chromium layer 25 provides a layer which facilitates electroplating of the nickel layer 22 to the transition structure 21.

A layer of gold 26 is vacuum vapor deposited over the second chromium layer 25 to a thickness falling within the range of 50–1,500 angstroms. The gold layer 26 eases processing of the wafers by reducing the formation of oxide on the chromium layer 25 which could otherwise interfere with proper plating of the nickel layer 22 onto the transition structure 21.

The nickel layer 22 is electroplated onto the transition structure 21 to a thickness falling within the range of 0.1–0.4 mils. The nickel layer 22 provides substantial strength for the copper portion 27 of the bump 19, such copper portion being electroplated over the nickel to a thickness falling within the range of 0.7–1.5 mils. The nickel reinforced copper bump 19 thus forms a relatively strong bump for gang thermal compression bonding to copper or other metallic interconnect lead patterns.

The thermal compression bonding bump 19, as adhered to the underlying metallic interconnect pattern 18 via the transition layers 21, provides a bump having substantially improved shear strength over the prior art. More particularly, a bump 19 of 12 square mils, at the interface with the transition layers 21, provides a shear strength of approximately 20 grams per square mil of interface between the bump 19 and the transition region 21. Shear strength is particularly advantageous for use in automatic thermal compression gang bonding machines where difficulties have heretofore been encountered by failure of the bond between the bump layers 27 and 22 and the underlying metallic interconnect pattern 18. Since all of the layers of the transition region 21 are formed by vacuum vapor deposition, these layers can all be sequentially deposited with one pump down of a vacuum evaporator or sputter apparatus.

What is claimed is:

1. The method of forming gang bonding bumps on integrated circuit semiconductive devices of the type having a metallic intraconnect pattern formed on the semiconductive device, such metallic pattern to be interconnect to other structure via the intermediary of metallic gang bonding bumps adhered to and rising above the metallic intraconnect pattern, the steps of:
   vacuum vapor depositing a layer of chromium within the range of 40 to 200 angstroms thickness overlaying the selected areas of the metallic intraconnect layer which are to receive the gang bonding bumps;
   vacuum vapor depositing a layer of aluminum and chromium within the range of 3,000 to 20,000 angstroms thickness over said chromium layer, such aluminum and chromium layer having a preponderance of aluminum therein;
   vacuum depositing a second layer of chromium within the range of 50 to 3,000 angstroms thickness overlaying the aluminum and chromium layer; and
   depositing the gang bnding bump overlaying the second chromium layer.

2. The method of claim 1 including the step of depositing a layer of gold within the range of 50 to 1,500 angstroms thickness overlaying the second chromium layer, and wherein the bump is deposited overlaying the gold layer.

3. The method of claim 2 wherein the gold layer is vacuum vapor deposited.

4. The method of claim 1 wherein the aluminum and chromium layer comprises between 0.1 and 5% by chromium.

5. The method of claim 1 wherein the metallic pattern forming a metallic intraconnect is made of aluminum.

6. In a semiconductive device of the type having gang bonding bumps adhered to an underlaying metallic intraconnect pattern via the intermediary of a multilayered transistion region, the transition region including:
   a layer of chromium within the range of 40 to 200 angstroms thickness overlaying the selected areas of the metallic intraconnect lyer which are to receive the gang bonding bumps;
   a layer of aluminum and chromium within the range of 3,000 to 20,000 angstroms thickness overlaying the chromium layer, such aluminum and chromium layer having a preponderance of aluminum therein; and
   a second layer of chromium within the range of 50 to 3,000 angstroms thickness overlying said chromium layer.

7. The device of claim 6 including a layer of gold within the range of 50 to 1,500 angstroms thickness overlaying the second chromium layer and forming part of the transition region.

8. The device of claim 6 wherein the aluminum and chromium layer comprises between 0.1 and 5% by volume of chromium.

9. The device of claim 6 wherein the metallic pattern forming the metallic intraconnect is made of aluminum.

10. The product made by the method of claim 1.

* * * * *